United States Patent [19]

Fushimi et al.

[11] Patent Number: 4,814,615
[45] Date of Patent: Mar. 21, 1989

[54] METHOD AND APPARATUS FOR DETECTING DEFECT IN CIRCUIT PATTERN OF A MASK FOR X-RAY EXPOSURE

[75] Inventors: Satoru Fushimi, Yokohama; Yasuo Nakagawa, Chigasaki; Asahiro Kuni, Tokyo; Hitoshi Kubota, Fujisawa; Hiroya Koshishiba, Yokohama, all of Japan

[73] Assignee: Hitachi, Ltd., Tokyo, Japan

[21] Appl. No.: 45,538

[22] Filed: May 4, 1987

[30] Foreign Application Priority Data

May 6, 1986 [JP] Japan .................. 61-102050

[51] Int. Cl.$^4$ ............................ H01V 37/28
[52] U.S. Cl. .................. 250/311; 250/307; 250/397
[58] Field of Search .............. 250/311, 492.2, 307, 250/397, 311

[56] References Cited

U.S. PATENT DOCUMENTS

| | | | |
|---|---|---|---|
| 4,044,254 | 8/1977 | Krisch et al. | 250/311 |
| 4,099,055 | 7/1978 | Todokoro | 250/311 |
| 4,503,329 | 3/1985 | Yamaguchi et al. | 250/309 |

FOREIGN PATENT DOCUMENTS 55-151757 11/1980 Japan .

Primary Examiner—Bruce C. Anderson
Assistant Examiner—Jack I. Berman
Attorney, Agent, or Firm—Antonelli, Terry & Wands

[57] ABSTRACT

In accordance with the present invention, there is provided a pattern defect detecting apparatus using a scanning and transmission electron microscope, comprising an electron gun for accelerating an electron beam with high energy enough to transmit it through a sample and for radiating the accelerated electron beam, a condenser lens for focusing the electron beam generated by said electron gun, a beam deflection coil for deflecting the electron beam focused by said condenser lens, an objective lens for further focusing the electron beam deflected by said beam deflection coil onto a fixed spot, an XY stage for disposing the sample so as to be opposed to said objective lens, said XY stage being movable in X and Y directions in a step and repeat manner, a sample chamber for housing the XY stage in vacuum, said sample chamber including at least the outlet of the electron beam of said objective lens, an electron beam detector for detecting electron beams transmitted through said sample, said electron beam detector being fixed to a stationary member such as said chamber or a lens barrel, and defect detecting means for scanning the electron beam by using said beam deflection coil for each step and repeat operation of said XY stage, for comparing a video signal obtained from said electron beam detector with a reference pattern read out from memory means, and for thereby detecting a defect of the sample.

15 Claims, 7 Drawing Sheets

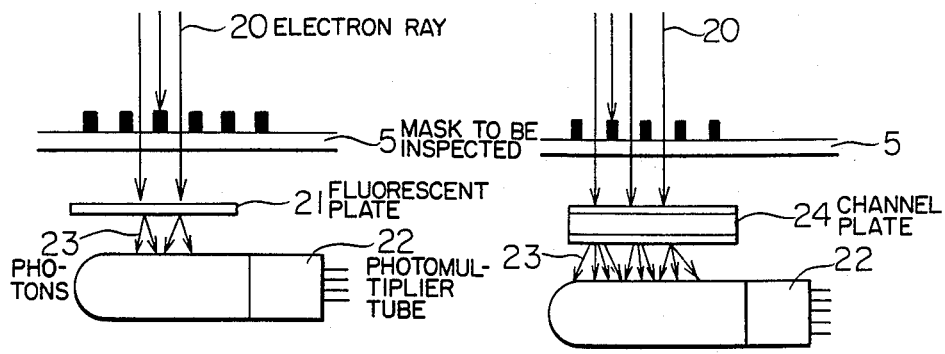
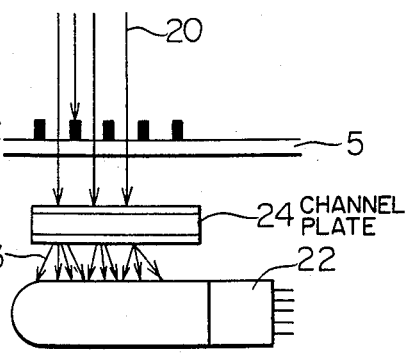
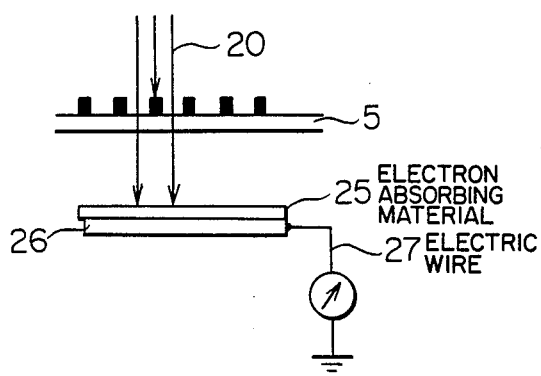
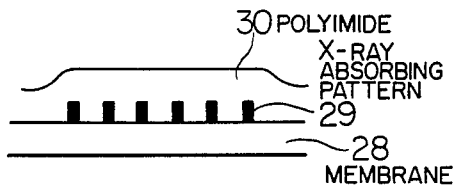

BN X-RAY MASK
(POLYIMIDE GUARD FILM OF 2μm)

BN X-RAY MASK
(POLYIMIDE GUARD FILM OF 0.5μm)

SiN X-RAY MASK
(POLYIMIDE GUARD FILM OF 2μm)

SiN X-RAY MASK
(POLYIMIDE GUARD FILM OF 0.5μm)

METHOD AND APPARATUS FOR DETECTING DEFECT IN CIRCUIT PATTERN OF A MASK FOR X-RAY EXPOSURE

BACKGROUND OF THE INVENTION

The present invention relates to a pattern defect detection apparatus using a scanning and transmission electron microscope optimum for inspecting a circuit pattern or the like formed on a mask to fabricate semiconductor devices or the like and in particular for inspecting a circuit pattern of a mask used for X-ray lithography.

Scanning and transmission electron microscopes (STEM) of the prior art are described in No. JP-A-55-151757 and "Microbeam Analysis" written by the 141-th committee (Microbeam Analysis) of Japan Association for Advancement of Science and Technology and published by Asakura Bookstore on June 1, 1985, pp. 199 to 206, for example.

In these STEMs of the prior art, however, defects of the circuit pattern of an X-ray mask or the like having a comparatively large size could not be detected accurately.

SUMMARY OF THE INVENTION

An object of the present invention is to provide a pattern detection apparatus using a scanning and transmission electron microsope capable of efficiently detecting defects of a circuit pattern on an X-ray mask.

In accordance with the present invention, there is provided a pattern defect detecting apparatus using a scanning and transmission electron microscope, comprising an electron gun for accelerating an electron beam with high energy sufficient to transmit it through a sample and for radiating the accelerated electron beam, a condenser lens for focusing the electron beam generated by the electron gun, a beam deflection coil for deflecting the electron beam focused by the condenser lens, an objective lens for further focusing the electron beam deflected by the beam deflection coil onto a fixed spot, an XY stage for disposing the sample so as to be opposed to the objective lens, the XY stage being movable in X and Y directions in a step and repeat manner, a sample chamber for housing the XY stage in vacuum, the sample chamber including at least the outlet of the electron beam of the objective lens, an electron beam detector for detecting electron beams transmitted through the sample, the electron beam detector being fixed to a stationary member such as the chamber or a lens barrel, and defect detecting means for scanning the electron beam by using the beam deflection coil for each step and repeat operation of the XY stage, for comparing a video signal obtained from the electron beam detector with a reference pattern read out from memory means, and for thereby detecting a defect of the sample. In particular, a sample is so placed on an XY stage moving in a "step and repeat" manner as to be opposed to an objective lens. In order to detect electron beams transmitted through the sample, the electron beam detector is so attached to the stationary member such as the sample chamber or lens barrel as to be stationary with respect to the objective lens. The above described XY stage is repetitively advanced by a predetermined distance and stopped (i.e., the XY stage steps and repeats). Whenever the XY stage is stopped, the electron beam is deflected by the beam deflection coil. And the video signal derived from the electron beam detector is compared with the reference pattern read out from the memory. It is checked with respect to the entire face of the sample by defect detecting means whether defects are present or not. Thereby, it is possible to carry out defect detection for a comparatively large sample such as a mask on the basis of the electron beam trassmission.

In accordance with the present invention, defects can be detected on the basis of the electron beam transmission. In case the sample is an X-ray mask used for X-ray lithography process, therefore, the requirement that a foreign substance which does not transmit X-rays must be judged defective and a foreign substance transmitting X-rays and hence posing no hindrance must not be judged defective is satisfied.

In accordance with the present invention, the acceleration voltage of the electron beam radiated from the electron gun is defined in the range of 150 to 350 kV (preferably 200 to 300 kV). Even if the mask surface is covered by a guard film such as polyimide like the case of an X-ray mask, therefore, the circuit pattern such as gold or tantalum and the guard film are not damaged. As a result, the pictures of the circuit pattern can be accurately detected by the electron beam detector, and defects can be detected with high reliability.

In accordance with the present invention, electron beams scattered by the pattern of the sample, are taken into one electron beam detector together with the electron beams scattered by the substrate portion. Since the contrast is thus improved, defects can be accurately detected without erroneously detecting regular circuit patterns or the like.

BRIEF DESCRIPTION OF THE DRAWINGS

FIG. 2 is a configuration diagram of an embodiment of an electron beam detector.

FIG. 3 is a configuration diagram of an embodiment of an electron beam detector using a channel plate.

FIG. 4 is a configuration diagram of an embodiment of an electron beam detector using an electron beam absorbing material.

FIG. 5 is a sectional view of an X-ray lithography mask.

BRIEF DESCRIPTION OF THE PREFERRED EMBODIMENT

Figure 1:
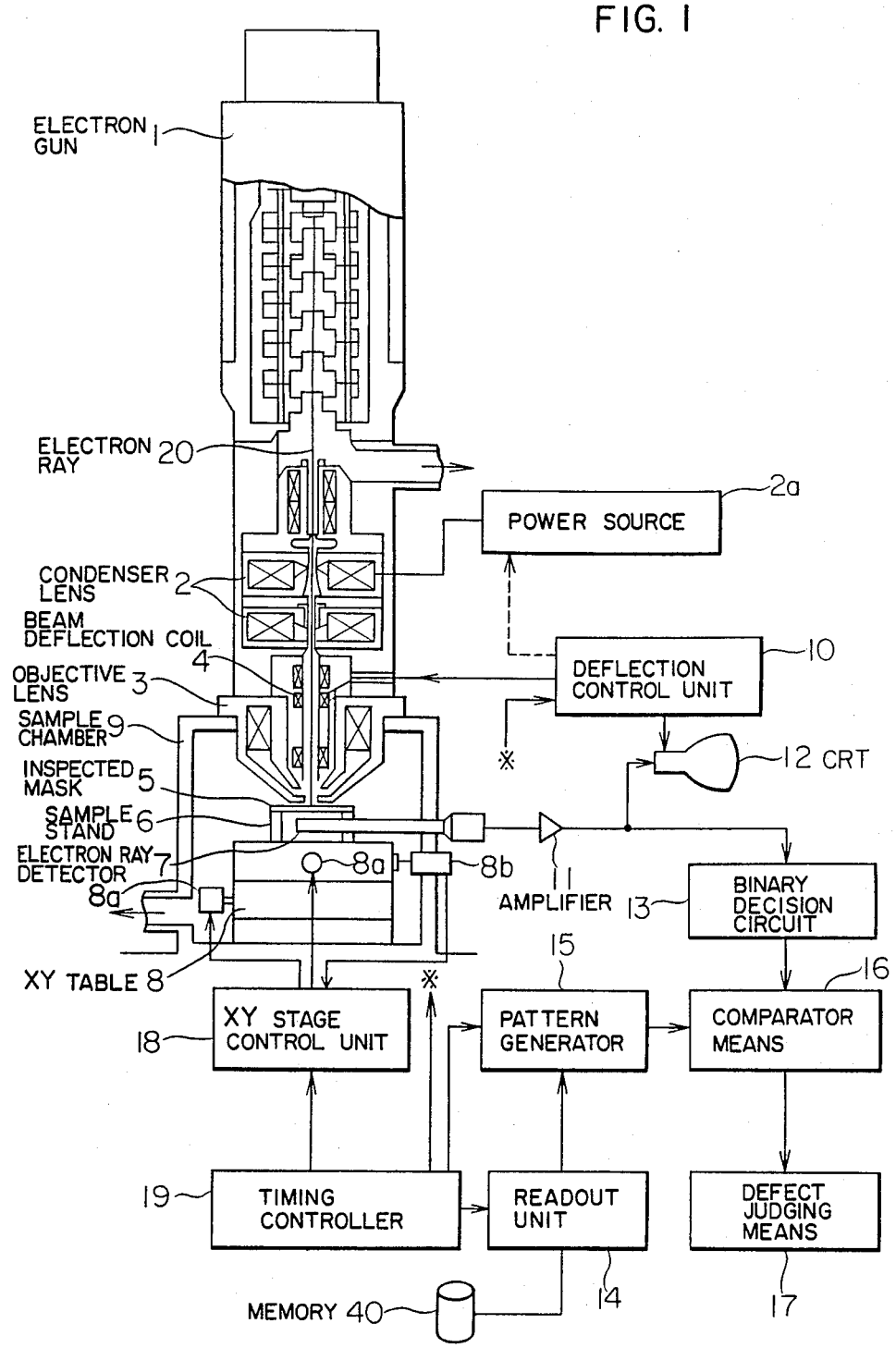
FIG. 1 is a configuration diagram of an embodiment of the present invention.

An embodiment of the present invention will now be described by referring to FIG. 1. An electron gun 1 has an electron beam accelerator for accelerating an electron beam by acceleration voltage of 150 to 350 kV (200 to 300 kV for optimum results) and radiates an accelerated electron beam 20. A condenser lens group 2 focuses the electron beam 20 accelerated and radiated by the electron gun 1. A beam deflection coil 4 deflects the electron beam focused by the condenser lens group 2 so that a range of approximately 0.14 mm$^2$ on a mask 5 to be inspected may be scanned. An objective lens 3 is disposed so as to focus the electron beam deflected by the beam deflection coil 4 onto a uniform spot even if the electron beam is deflected on the mask 5 to be inspected. A sample stand 6 carries a mask 5 to be inspected having a size of approximately 20 to 50 mm$^2$ so that the mask 5 may be opposed to the objective lens 3 via a minute gap formed between them. An elecrron beam detector 7 is composed of a combination of a fluorescent plate 21 and a photomultiplier 22 as shown in FIG. 2, for example. The electron beam detector 7 is attached to the objective lens 3, a sample chamber 9 or the like so that the light receiving section may stand still on the rear face of the mask 5 to be inspected. In particular, the electron beam detector 7 is provided with a light receiving face having such a size that the detector may receive electron beams transmitted through the inspected mask 5 and electron beams scattered by the inspected mask 5 together. That is to say, the light receiving face of the electron beam detector 7 has such a size as to accommodate nearly up to a scattering angle $\theta$ where the substrate portion of the inspected mask 5 and the pattern section thereof are detected with nearly equal electron intensities. An XY table 8 has a movable range in X and Y directions which is at least the size of the inspected mask 5. The XY table 8 moves and stops at an interval of approximately 0.12 mm in the "step and repeat" manner. The XY table 8 is so formed that the sample stand 6 may be mounted on the upper face thereof and the light receiving section of hhe electron ray detector 7 may be inserted between the upper face of the XY table 8 and the rear face of the inspected mask 5. A sample chamber 9 is connected to a vacuum source for evacuation and is configured to house the above described objective lens 3 at the upper portion thereof. The sample chamber 9 is also configured to house the sample stand 6 and the XY table 8 therein. In particular, a drive source 8a for moving the XY table 8 is preferably disposed outside the sample chamber 9 in order not to pollute the vacuum of the sample chamber 9. However, it is evident that the drive source 8a may be disposed within the sample chamber provided that the drive source 8a does not exhaust oil or the like. Two laser length measuring instruments 8b are disposed on side walls of the sample chamber 9 for the X table and Y table, respectively. (One of the laser length measuring instruments 8b is not illustrated.) The two laser length measuring instruments are configured to measure the displacements of the X table and the Y table with high precision, respectively. A deflection control unit 10 controls the beam deflection coil 4 to scan the electron beam. An amplifier 11 amplifies a video signal supplied from the electron beam detector 7. A CRT 12 displays the image of a local region (a region scanned by the beam deflection coil 4) of the inspected mask by running a video signal (a luminance signal) supplied from the above described amplifier 11, on the basis of a deflection control signal having a sawtooth waveform supplied from the above described deflection control unit 10. A binary decision circuit 13 converts the video signal supplied from the above described amplifier 11 into a binary-valued picture element signal by converting the video signal into a binary value by means of a predetermined threshold and sampling the video signal at a predetermined repetition period. On the basis of a readout directive signal outputted from a timing controller 19 for each region scanned by the beam deflection coil 4, a reference pattern data readout unit 14 reads out reference pattern data stored in memory means 40 such as a disk. (Reference pattern data are created based on design data, for example.) On the basis of a signal indicating the coordinate position synchronized to the deflection control signal, a reference pattern generator 15 generates a reference pattern by using binary-valued picture element signals. A comparator means 16 compares the binary-valued picture element signal with the reference pattern under the state that there is no relative positional displacement between them. On the basis of a signal indicating the noncoincidence supplied from the above described comparator means, a defect judging means 17 judges whether there is a defect or not. That is to say, the defect judging means 17 outputs a defect signal provided that there is a defect on the inspected mask 5. On the basis of the displacement data of the XY table measured by the laser measuring instrument 8b, an XY stage control unit controls the XY table 8 so as to advance and stop (or step and repeat) it in X and Y directions at a predetermined interval, say, 0.12 mm. A timing controller 19 suppiies a directive signal for making the XY table 8 step and repeat to the XY stage control unit 18 and supplies a deflection directive signal to the deflection control unit 10 after the XY table 8 has stopped. In addition, the timing controller 19 is configured to supply the reference pattern generator 15 with a signal which is synchronized to the deflection directive signal supplied to the deflection control unit 10.

The electron beam 20 generated by the electron gun 1 is so focused as to form a spot on the inspected mask 5 by the condenser lens group 2 and the objective lens 3. In the present embodiment, the focusing is magnetically carried out. However, the focusing may also be carried out electrostatically. This holds true for the deflection system, as well. The acceleration voltage (150 to 350 kV) of electrons is high enough to transmit electrons through the mask 5, and the size of the spot is smaller than the size of the defect to be detected. By means of the deflection coil 4 driven by the deflection control unit 10, the electron beam 20 scans a region of approximately 0.14 mm$^2$ on the mask 5 in a two-dimensional manner. Electrons transmitted through the mask 5 and scattered are detected by the electron beam detector 7 to generate an output signal depending upon the amount of transmitted electrons. The sample stand 6 is so fixed on the XY table 8 as to assure a space for disposing a transmitted electron beam detector 7 between the mask 5 and the XY table 8. Further, the upper face of the sample stand 6 adjoining the sample is provided with a hole to transmit the electron beam. The size of a portion of the electron beam detector 7 whereto the electron beam is applied is wider than the region over which the electron beam is deflected by the deflection coil 4 and has such an aperture that transmitted electrons may be detected by the electron beam detector 7 in whichever direction the electron beam is deflected. The size of the hole opened in the upper face of the sample stand 6 is sufficiently large in the same way. In the electron beam path, the lens barrel and the sample chamber 9 are kept at sufficiently high vacuum in order not to prevent the passage of electrons. Further, a power source 2a for focusing the electron beam may also be configured to be controllable by the deflection control unit 10.

The electron beam detector 7 is composed of a combination of a fluorescent plate 21 and a photomultiplier 22. Electrons transmitted through the mask strike against the fluorescent plate to generate photons 23 therefrom. The photons are applied to the photomultiplier tube to be converted into a current, resulting in a detected signal of mask pattern.

In the present embodiment, a photomultiplier tube is used as means for detecting photons generated from the fluorescent plate 21. So long as a sufficient sensitivity is obtained, however, photodetector devices such as photodiodes or CdS may be used instead. Further, a channel plate 24 may be used instead of the fluorescent plate as shown in FIG. 3. When electrons are applied to the channel plate, a large number of electrons are generated within the channel plate by the electron multiplication function. And these electrons are generated in a fluorescent plate located at the output end. Even if an extremely small number of electrons are applied to the channel plate, therefore, it is possible to make the fluorescent plate luminous brightly. Accordingly, it is possible to reduce the amount of electron beam and minimize the damage caused by the electron beam and the change in pattern dimension caused by the temperature rise. Another example of the electron beam detector is shown in FIG. 4. The electron beam detector is composed of a metal plate 26 covered by a material 25 which easily absorbs and hardly reflects electrons of carbon, for example. The electron beam detector is electrically insulated as a whole. An electric wire is pulled out from one position of the metal plate to ground the metal plate to the lens barrel. If an electron beam is transmitted through the mask to strike against the electron absorbing material 25, the electron beam is absorbed to flow to the lens barrel via the metal plate and the electrical wire 27 in the form of a current. When the electron beam is scanning over a membrane, a large amount of electrons are transmitted and absorbed into the plate, resulting in a larger current flowing through the electric wire. When the electron beam is scanning over the circuit pattern, a small amount of electrons are transmitted, resulting in less current flowing through the electric wire. Therefore, the circuit pattern can be detected by detecting the value of the current flowing through the electric wire.

At first, the timing controller 19 outputs a directive signal to make the XY table 8 step and repeat at a predetermined interval via the XY stage control unit 18. After the inspected mask 5 has been stopped, the timing controller 19 supplies a deflection start signal to the deflection control unit 10. The beam deflection coil 4 is thus activated to deflect the electron beam spot focused to a fixed point in the X and Y directions. As a result, the inspected mask 5 is scanned. The electron beam detector 7 receives electrons transmitted through the inspected mask 5 and scattered within a particular angle $\theta$ together and converts them into a video signal to be outputted.

After the output signal of the electron beam detector 7 has been amplified to a suitable level by the amplifier 11, it is converted into a binary-valued picture element. For a portion transmitting the X-rays, a binary-valued picture element signal "1" is obtained. For a portion which does not transmit the X-rays, namely, a circuit pattern portion, a binary-valued picture element signal "0" is obtained. On the basis of a directive supplied from the timing controller 19, the reference pattern data readout unit 14 reads out the reference pattern data of the region now deflected by the deflection coil 4 out of the reference pattern data of the entire mask stored in the memory means 40. The reference pattern data thus read out is outputted to the reference pattern generator 15 in synchronism with the above described deflection. On the basis of deflection coordinates directed by the timing controller 19, the reference pattern generator 15 generates the reference pattern signal formed by the binary-valued picture signals.

Figure 6:
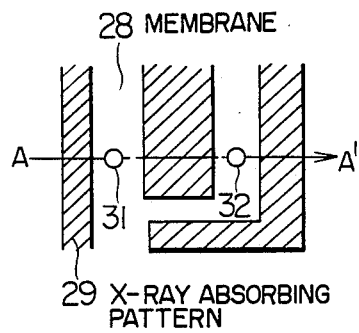
FIG. 6 shows an example of a pattern on a mask.
Figure 7:
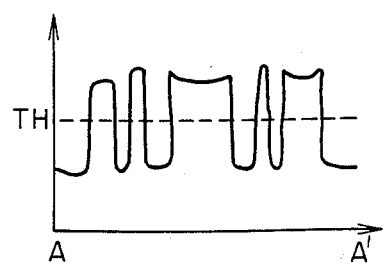
FIG. 7 shows a detected signal of reflected electrons or secondary electrons of a mask.
Figure 8:
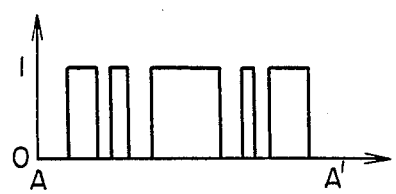
FIG. 8 shows a detected signal of circuit pattern obtained by converting the detected signal of FIG. 7 into binary values.
Figure 9:
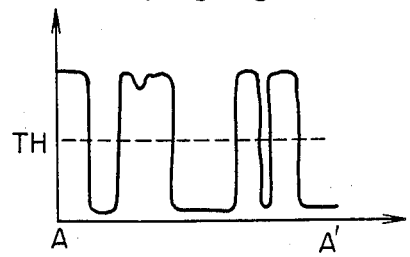
FIG. 9 shows a detected signal of electrons transmitted through a mask.
Figure 10:
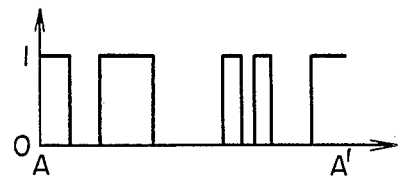
FIG. 10 shows a detected signal of circuit pattern obtained by converting the detected signal of FIG. 9 into binary values.
Figure 11:
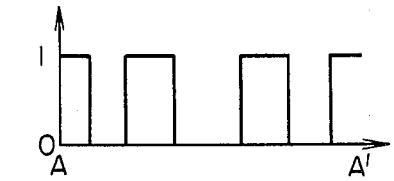
FIG. 11 shows a detected signal of circuit pattern obtained when there are no defects.
Figure 12:
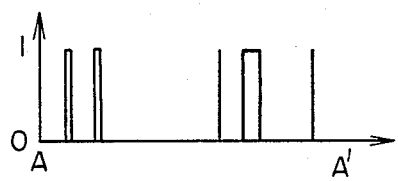
FIG. 12 shows the output signal of a comparator circuit.
Figure 13:
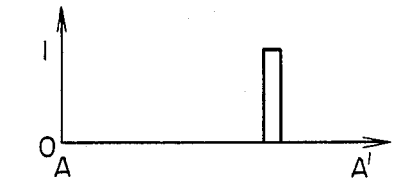
FIG. 13 shows the output signal of a defect judging means.

In the comparator circuit 16, the binary-valued picture element signal outputted from the above described binary decision circuit 13 is aligned in position and thereafter compared with the defectless reference pattern signal generated by the reference pattern generator 15. The noncoincident portions between them are outputted. The defectless reference pattern signal generated by the reference pattern generator 15 when a line A—A' shown in FIG. 6 is scanned by the electron beam. FIG. 6 shows an example of an X-ray mask pattern wherein a circuit pattern 29 is formed on a membrane portion 28, the circuit pattern portion absorbing X-rays. 31 designates foreign matter which easily transmits the X-ray and 32 designates other foreign matter which cannot transmit the X-ray. The foreign matter 31, which easily transmits the X-ray should not be considered a defect, whereas the foreign matter 32, which cannot transmit the X-ray should be considered a defect and by utilizing processing and waveforms as illustrated in FIGS. 7–13, noncoincidence with a defectless reference pattern signal is detected. The detected signal indicating the noncoincidence outputted by the comparator circuit 16 at that time is shown in FIG. 12. The defect judging circuit detects only noncoincident portions having magnitude exceeding the pattern dimension tolerance and judges them defective. FIG. 13 shows an example of a signal representing the defect decision.

Scanning of the electron beam, the reference pattern data, and the reference pattern generator are mutually synchronized by the timing controller 19. Accordingly, the defectless pattern detection signal corresponding to the mask pattern actually detected is generated by the reference pattern generator for comparison. After all regions which can be scanned by the electron beam have been inspected, the XY table control unit 18 drives the XY table 8 on the basis of the directive supplied from the timing controller 19. Thus the XY table 8 step and repeat. As a result, areas of the mask which have not been inspected yet are scanned by the electron beam for inspection. The movement of the XY table and the inspection are repeated until the entire surface of the mask has been inspected.

The amplified signal of the electron beam detector is supplied to the CRT 12 scanned in synchronism with the deflection control unit 10 and displayed on the CRT as a two-dimensional image. If the XY table is moved to apply the electron beam to the detected defect after the termination of the inspection and the electron beam is scanned, the two-dimensional image of electrons transmitted through the defect is displayed on the CRT.

In the present embodiment, the pattern detection signal of the inspected mask is compared with the defectless pattern detection signal generated from the design data. In case a plurality of identical circuit patterns are present on the mask, however, the detection signal of one circuit pattern may be temporarily stored and this signal may be reproduced to be used as the reference pattern for comparison in synchronism with the detection of another inspected pattern. Since both patterns are originally the same, noncoincident portions may be judged defective. This method needs a memory for temporarily storing the circuit pattern or a memory unit such as a disk unit. However, the reference pattern readout unit and the reference pattern generator are not required. Therefore, the unit cost can be reduced. In addition, high speed inspection becomes possible without the restriction in inspection speed due to the readout speed of the reference pattern data readout unit.

Figure 14:
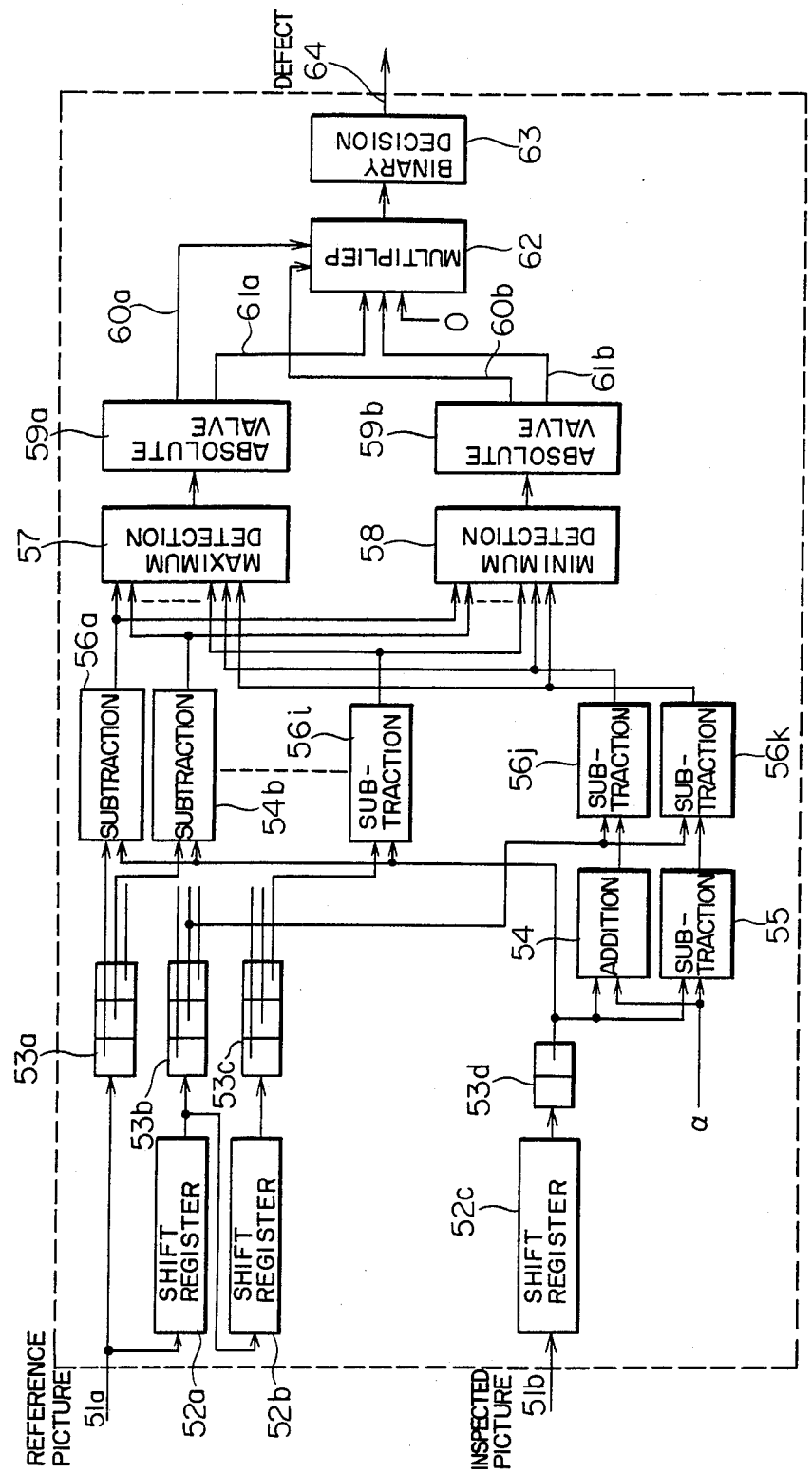
FIGS. 14 and 15 show the concrete configuration of the comparator means and the defect judging means, respectively.
Figure 15:
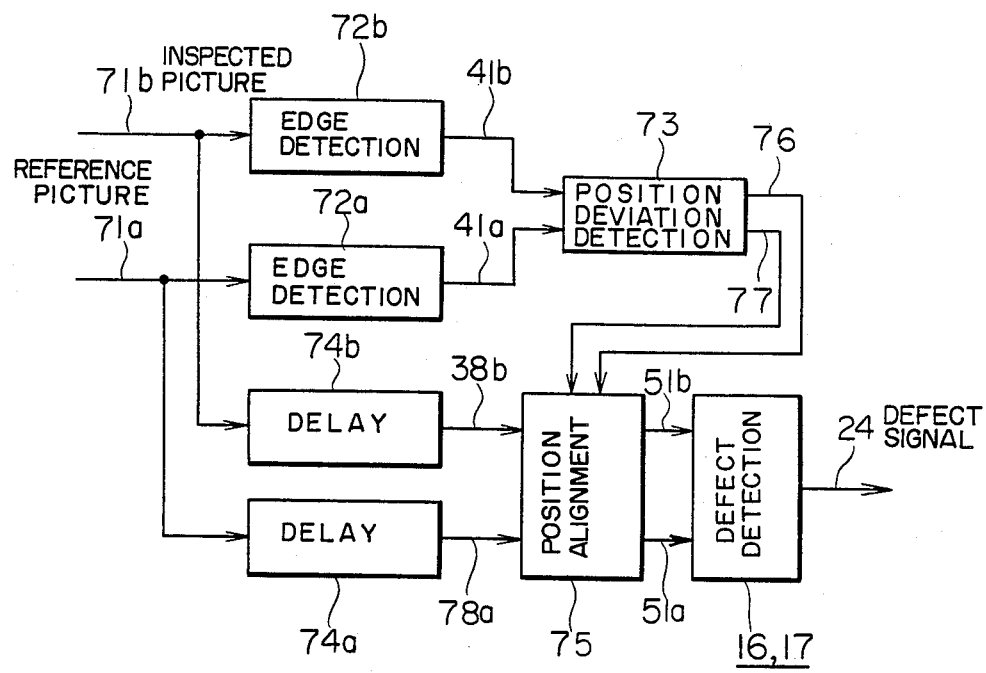

The comparator means 16 and the defect judging means 17 will now be concretely described by referring to FIGS. 14 and 15.

Numerals 51a and 51b denote a reference picture and an inspected picture which have been aligned in position, respectively. A local picture having 3×3 picture elements is extracted from the reference picture 51a by shift registers 52a and 52b for delaying the picture by one scanning line and serial-in parallel-out shift registers 53a, 53b and 53c. On the other hand, the inspected image 51b undergoes delay and serial-in to parallel-out conversion by using a similar shift register 52c and a serial-in parallel-out shift register 53d. The output of the shift register 53d is synchronized to the center position of the above described local image. Thereafter, respective outputs of the shift registers 53a to 53c and the output of the shift register 53d undergo subtraction in subtraction circuits 56a to 56i. This results in a difference picture between the inspected picture 51b and the picture obtained by respectively shifting the reference picture 51a in X and Y directions by ± one picture element. The steps to this point corresponding to a processing procedure (1) described later. On the other hand, the output of the shift register 53d and a preset value α undergo addition and subtraction in an addition circuit 54 and a subtraction circuit 55, respectively. The outputs of the addition circuit 54 and the subtraction circuit 55 undergo subtraction respectively in subtraction circuits 56j and 56k with respect to the picture element of the above described local picture having 3×3 picture elements. This corresponds to processing procedure (2) which will be described later.

Respective outputs of the described subtraction circuits 56a to 56k are supplied to a maximum detection circuit 57 and a minimum detection circuit 58, respectively. Absolute values of the resultant maximum and minimum values are computed in absolute value circuits 59a and 59b, respectively. The absolute value circuits 59a and 59b send out signs 60a and 60b of the input signal together with the absolute values 61a and 61b of the input signal. A multiplexer 62 is supplied with the absolute value 61a of the maximum value, the absolute value 61b of the minimum value, and a constant 0. Depending upon the sign 60a of the maximum value and the sign 60b of the minimum value similarly supplied, the multiplexer 62 selects and outputs one of the three input values. That is to say, the multiplexer 62 outputs 0 when one of the signs 60a and 60b is positive and the other is negative. The multiplexer 62 outputs the absolute value 61b of the minimum value when both the signs 60a and 60b are positive or both the signs 60a and 60b are negative. The steps described hitherto correspond to processing procedure (3) which will be described later. The output of the multiplexer 62 is converted into a binary value by a binary decision circuit 63. The defect signal is thus outputted (as described in processing procedure (4) later). Owing to the above described operation, it becomes possible to allow a minute dimension difference between the reference picture 51a and the inspected picture 51b which does not result in a defect. And only true defects can be detected.

FIG. 15 is a block diagram for illustrating the entire configuration of a picture processing circuit including the defect detection circuit 16 and 17 shown in FIG. 15. In FIG. 15, a reference picture 71a and an inspected picture 71b photographed by using photoelectric conversion devices are at first supplied to edge detection circuits 72a and 72b for attaining the position alignment, respectively. In the edge detection circuits 72a and 72b, respective inputted pictures undergo the second derivative to emphasize the pattern edges and are converted into binary values. By using the edge picture thus converted into binary values, a position deviation detection circuit 73 computes the position deviation values 76 and 77 between two patterns to be computed in the X and Y directions. Delay circuits 74a and 74b are buffer memories respectively for holding the reference picture 71a and the inspected picture 71b until the position deviation value between the two patterns has been computed. The position alignment between the two aatterns can be attained by shifting in a position alignment circuit 75 the outputs of the delay circuits 74a and 74b by values depending upon the outputs 76 and 77 of the above described position deviation detection circuit 73. The reference picture 51a and the inspected picture 51b which have thus undergone the position alignment are supplied to the defect detection circuit 16 and 17 having the configuration shown in FIG. 14, resulting in the defect detection.

The defect detection is attained by carrying out the processing described below after two pictures to be compared have been aligned in position.

(1) With respect to the inspected picture (picture signal f(x, y)), the reference picture (picture signal g(x, y)) is shifted in x and y directions by ±1 picture elements, respectively. The difference in brightness between the inspected picture and the reference picture (picture signal $g(x-i, y-j)_{i,j=-1,0,1}$) including the shifted picture is computed. By this computation, 9 differential pictures (picture signals $D_n(x, y)_{n=1\ to\ 9}$) are obtained.

(2) A picture is so produced as to have a picture signal value g(x, y)±α obtained by adding/subtracting a predetermined value α to/from the picture signal g(x, y) of the reference picture. The difference in brightness between the picture thus produced and the inspected picture (picture signal f(x, y)) is computed. By this computation, two difference pictures (picture signal $D_n(x, y)_{n=10\ 11}$) are obtained.

(3) With respect to the picture signal $D_n(x, y)_{n=1\ to\ 11}$ of 11 differential pictures in total derived from (1) and (2), processing described below is effected to produce the output h(x, y).

(a) When max $\{D(x, y)\}_{n=1 \text{ to } 11} \times$ min $\{D(x, y)\}_{n=1 \text{ to } 11} <$ , h(x, y)=0

(b) Otherwise, h(x, y)=min $\{|D(x, y)|\}_{n=1 \text{ to } 11}$.

(4) In case of (b), the output h(x, y) is converted into a binary value by using a predetermined threshold TH. And the portion represented as h(x, y)≧TH is outputted as defective.

The detection method by using the electron beam detector 7 will now be described concretely.

The sample stand 6 is fixed on the XY stage 8. Between the inspected mask 5 held on the upper face of the sample stand 6 and the XY stage 8, an exit diaphragm 42 and the electron beam detector 7 are disposed. And the sample stand 6 has a hole 6a for passing electrons transmitted through the inspected mask 5.

In order to limit the scattering angle $\theta$ of electrons passed through the exit diaphragm 42 below 5° to 25°, the diameter of the exit diaphragm is variable or several kinds of replaceable diaphragms having different diaphragm diameters are prepared. Or the exit diaphragm movable in the vertical direction is used. Instead of providing the exit diaphragm 42, an optimum detection angle may be obtained by controlling the size of the detection face of the electron beam detector 7 or the distance between the detection face and the inspected mask 5.

Figure 16:
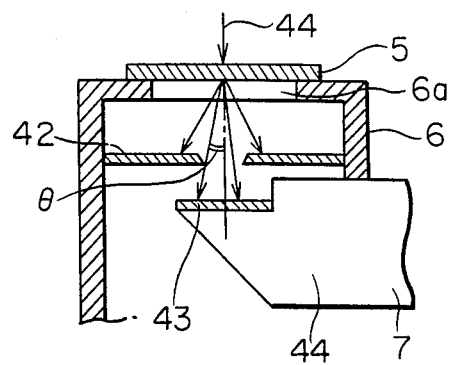
FIG. 16 concretely shows an electron beam detector and its periphery.

As shown in FIG. 16, the electron beam detector 7 has a light receiving face (scintillator) 43, a light guide 44, and a photomultipier tube which is not illustrated. The electron beam 20 is applied to the inspected mask 5 and scattered. When the electron beam has reached the light receiving face (scintillator) 43 at a scattering angle limited within a detection angle $\theta$ defined by the exit diaphragm 42, electrons are converted into light. The resultant light is conveyed through the light guide 44 and converted into an electrical signal at the photomultiplier tube. However, the electron beam detector 7 is not limited to this structure. For example, a semiconductor detector for detecting electron beam may be used.

The value of the detection angle $\theta$ maximizing the detection contrast varies depending upon the acceleration voltage of electrons and the configuration of the inspected mask 5. However, the optimum value of the detection angle $\theta$ is approximately 5° to 25°.

The reason why the electron beams transmitted through the inspected object within the scattering angle $\theta$ are taken in by the light receiving face 43 of the electron beam detector 7 will now be described with reference to FIGS. 17 and 18 by taking an X-ray mask as an example.

Figure 17A:
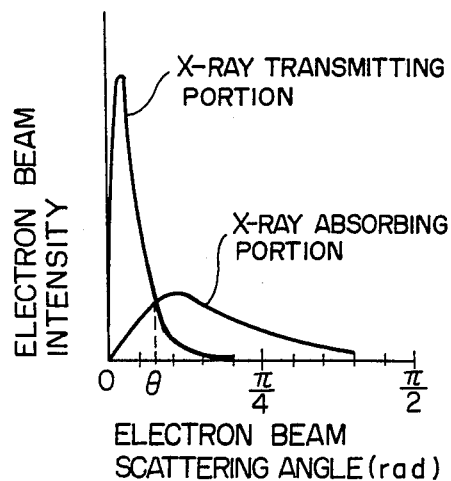
FIG. 17 shows the relationship between the electron beam scattering angle in an X-ray mask and the electron beam intensity.
Figure 17B:
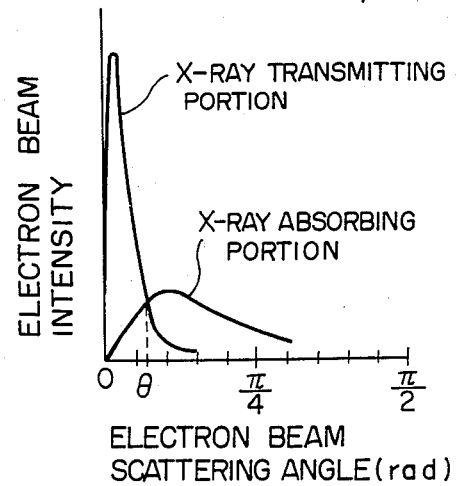
Figure 17C:
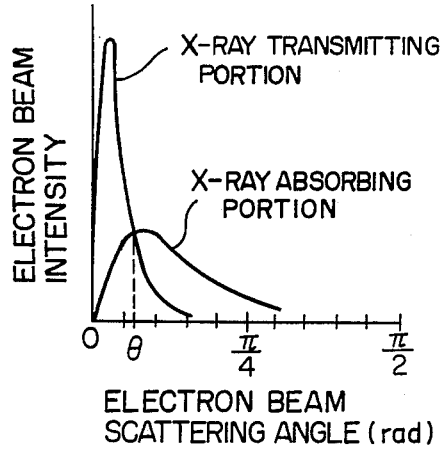
Figure 17D:
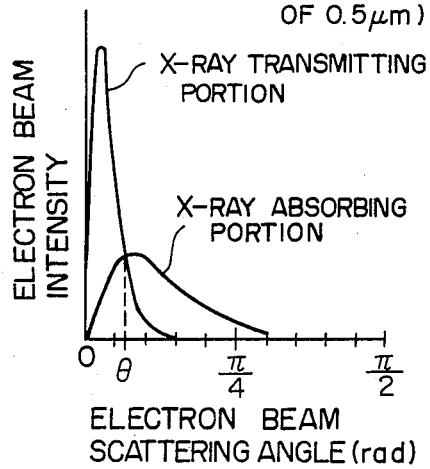

FIGS. 17A through 17D show examples of scattering distribution of the X-ray transmitting portion and the X-ray absorbing portion obtained as a result of simulation of electron beam scattering using the Monte-Carlo method. The simulation of FIGS. 17A through 17D was carried out under the condition that the acceleration voltage of incident electron was 200 kV. The model used a the X-ray lithography mask in FIG. 17A is a BN X-ray mask which includes a membrane composed of BN having thickness of 2 μm and polyimide having thickness of 3 μm and which includes a guard film composed of polyimide having thickness of 2 μm. The model used in FIG. 17B is a BN X-ray mask which includes a membrane composed of BN having thickness of 2 μm and polyimide having thickness of 3 μm and which includes a guard film composed of polyimide having thickness of 0.5 μm. The model used in FIG. 17C is a SiN X-ray mask which includes a membrane composed of SiN having thickness of 2 μm, an X-ray absorbing pattern composed of Ta having thickness of 0.75 μm, and a guard film composed of polyimide having thickness of 2 μm. And the model used in FIG. 17D includes a membrane composed of SiN having thickness of 2 μm, an X-ray absorbing pattern composed of Ta having thickness of 0.75 μm, and a guard film composed of polyimide having thickness of 0.5 μm.

As evident from FIG. 17, the detection angle maximizing the detected signal for the X-ray transmitting portion of the X-ray lithography mask differs from that for the X-ray absobbing portion because of difference in electron beam scattering distribution between both portions.

Figure 18:
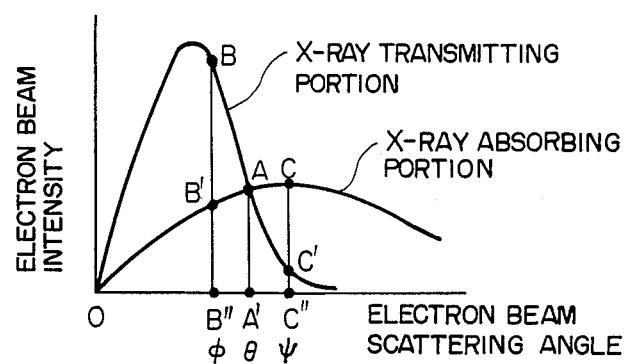
FIG. 18 is a generalized view of FIG. 17.

As shown in FIG. 18, the electron beam scattering angle at an intersection A of the scattering distribution curve of the X-ray transmitting portion and the scattering distribution curve of the X-ray absorbing portion is represented by $\theta$. The detection contrast becomes the largest in a STEM detecting electrons having scattering angles not more than the angle $\theta$, namely, in a STEM having a detection angle $\theta$. The reason will now be described.

Assuming that the detection angle is $\theta$, the detected signal of the X-ray transmitting portion is equal to a value obtained by integrating the scattering distribution curve of the X-ray transmitting portion from 0 to $\theta$. That is to say, the detected signal of the X-ray transmitting portion is equal to the area of a region surrounded by a curve OBA, a straight line OA', and a straight line AA'. In the same way, the detected signal of the X-ray absorbing portion is equal to a value obtained by integrating the scattering distribution curve of the X-ray absorbing portion from 0 to $\theta$, i.e., the area of a region surrounded by a curve OB'A, a straight line OA', and a straight line AA'.

Therefore, the detected contrast corresponds to the difference between the detected signal of the X-ray transmitting portion and the detected signal of the X-ray absorbing portion, i.e., the area of a region surrounded by the curves OBA and OB'A.

If it is supposed that the detection angle is $\phi$ smaller than $\theta$, the detected contrast corresponds to the area of a region surrounded by a curve OB, a curve OB' and a straight line BB'. This contrast is smaller than the contrast obtained when the detection angle is $\theta$ by the area of a region surounded by curves AB and AB' and a straight line BB'.

Supposing that the detection angle is an angle 4 larger than the above described $\theta$, the contrast corresponds to an area obtained by subtracting the area of a region surrounded by curves AC and AC' and a straight line CC' from the area of a region surrouded by curves OBA and OB'A. This contrast is smaller than the contrast obtained when the detection angle is $\theta$ by the area of the region surrounded by the curves AC and AC' and the straight line CC'.

From the above described results, it is evident that the contrast becomes the largest when the detection angle is $\theta$.

The value of $\theta$ varies to some degree depending upon the mask model shown in FIG. 17. However, this value is close to $\pi/16$ rad (approximately 11°) in any of four computed cases (FIGS. 17A through 17D). It is considered that the value of $\theta$ does not vary largely. The value of θ becomes smaller when the acceleration voltage of electrons is higher than 200 kV and becomes larger when the acceleration voltage of electrons is lower than 200 kV.

By making the STEM detection angle $10^{-1}$ rad or more, i.e., 5° to 25° in accordance with the present invention, therefore, the contrast becomes the largest as compared the convention case having a detection angle of approximately $10^{-4}$ rad, resulting in high contrast detection. In addition, the optimum detection angle becomes a value significantly larger than the conventional value, i.e., $10^{-1}$ rad or more. Accordingly, the proportion of the detected electrons to the radiated electrons can be increased.

Since the S/N ratio of the detected signal is considered to be proportionate to the square root of the number of detected electrons, the S/N ratio of the present invention is improved by approximately 10 to 100 times. As a result, the pattern defect inspection of masks can be carried out at high speed.

In the circuit pattern inspection of a mask used for X-ray lithography process, the present invention described above makes it possible to prevent erroneous defect detecton caused by a foreign substance transmitting X-rays. In addition, the pattern can be detected even if a guard film of polyimide or the like is present on the surface. As a result, the reliability of inspection is improved.

We claim:

1. An apparatus including a scanning and transmission electron microscope for detecting a defect in a circuit pattern of a mask for X-ray exposure, said mask being composed of a membrane having at least one circuit pattern formed thereon, comprising:
    electron gun means for accelerating an electron beam with high energy sufficient to transmit said electron beam through said mask and for radiating the accelerated electron beam;
    means for focusing the electron beam radiated by said electron gun means;
    deflection means for deflecting the electron beam focused by said focusing means;
    additional focusing means including an objective lens for focusing the deflected electron beam to a fixed spot;
    XY stage means for mounting said mask so as to be opposed to said objective lens, said XY stage means being movable in X and Y directions in a step and repeat manner;
    chamber means for housing said XY stage means in a vacuum, said chamber means enabling the electron beam focused by said objective lens to pass therethrough onto said mask mounted on said SY stage means;
    electron beam detector means disposed with respect to said mask for enabling simultaneous detection of electrons of the electron beam transmitted through said mask and scattered by the at least one circuit pattern and electrons transmitted through said mask and scattered by said membrane within a predetermined detection angle corresponding to a scattering angle at which the intensity of electrons obtained at the at least one circuit pattern is substantially equal to the intensity of electrons obtained at said membrane; and
    defect detecting means for controlling scanning of the electron beam on said mask by said beam deflection means for each step and repeat operation of said XY stage means and for comparing a signal obtained from said electron beam detector means with a signal of a reference pattern so as to detect of said mask.

2. An apparatus according to claim 1, wherein said predetermined detection angle is between 5° and 25°.

3. An apparatus according to claim 2, wherein said predetermined detection angle is about 11°.

4. An apparatus according to claim 1, further comprising diaphragm means disposed between said mask and said electron beam detector means for controlling the detection angle of said electron beam detector means.

5. An apparatus according to claim 1, wherein said mask further includes a guard film formed on the at least one circuit pattern.

6. An apparatus according to claim 4, wherein said means for focusing the electron beam radiated by said electron gun means includes a condenser lens, said deflection means includes a beam deflection coil, said electron beam detector means is fixedly secured to a stationary portion of said apparatus including one of said chamber means and a lens barrel, and said defect detecting means controls scanning of the electron beam by using said beam deflection coil for each step and repeat operation of said XY stage means and for comparing a video signal obtained from said electron beam detector means with the reference pattern signal obtained from a memory means.

7. An apparatus according to claim 6, wherein said predetermined detection angle is between 5° and 25°.

8. An apparatus according to claim 7, wherein said predetermined detection angle is about 11°.

9. An apparatus according to claim 6, wherein said mask further includes a guard film formed on the at least one circuit pattern.

10. A method of detecting a defect in at least one circuit pattern of a mask for X-ray exposure, the mask being composed of a membrane having at least one circuit pattern formed thereon, comprising the steps of:
    disposing the mask for X-ray exposure on an XY stage within a vacuum environment of a sample chamber having an opening therein for enabling an electron beam to pass therethrough;
    scanning the mask over a wide range by moving the XY stage in X and Y directions in a step and repeat manner;
    radiating the electron beam from an electron gun under acceleration with energy sufficient for transmitting the electron beam through the mask for each movement of the XY stage in the step and repeat manner, the electron beam being focused by a condenser lens and the focused electron beam being deflected by means of a beam deflection coil with the deflected electron beam being focused onto the mask in the form of a predetermined spot by an objective lens;
    detecting the electron beam by electron beam detector means disposed with respect to the mask for enabling simultaneous detection of electrons of the electron beam transmitted through the mask and scattered by the at least one circuit pattern and electrons transmitted through the mask and scattered by the membrane within a predetermined detection angle corresponding to a scattering angle at which the intensity of electrons obtained at the at least one circuit pattern is substantially equal to the intensity of electrons obtained at the membrane and deriving a video signal corresponding to the at least one circuit pattern;

converting the video signal into a picture element signal; and comparing the picture element signal with a reference picture element signal representing a reference pattern read out from storage means to thereby enable detection of a defect in the at least one circuit pattern on the mask for X-ray exposure.

11. A method according to claim 10, further comprising the step utilizing a scanning and transmission electron microscope, and disposing a diaphragm between the mask and the electron beam detector means for controlling the detection angle of the electron means detector means.

12. A method according to claim 10, wherein the predetermined detection angle is between 5° and 25°.

13. A method according to claim 12, wherein the predetermined detection angle is about 11°.

14. A method according to claim 10, further comprising the step of setting a voltage for accelerating the electron beam radiated from the electron gun to a value in the range of 150 kV to 350 kV.

15. A method according to claim 10, further comprising the step of forming a guard film on the at least one circuit pattern of the mask.

* * * * *